United States Patent
Engelhardt

(10) Patent No.: US 6,387,773 B1
(45) Date of Patent: May 14, 2002

(54) METHOD FOR FABRICATING TRENCHES HAVING HALLOWS ALONG THE TRENCHES SIDE WALL FOR STORAGE CAPACITORS OF DRAM SEMICONDUCTOR MEMORIES

(75) Inventor: Manfred Engelhardt, Feldkirchen-Westerham (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/607,355

(22) Filed: Jun. 30, 2000

(30) Foreign Application Priority Data

Jun. 30, 1999 (DE) .......................... 199 30 188

(51) Int. Cl.⁷ ............................... H01L 21/20
(52) U.S. Cl. ................... 438/386; 438/243; 438/244; 438/396
(58) Field of Search ................ 438/243–249, 438/386–392

(56) References Cited

U.S. PATENT DOCUMENTS 4,906,590 A  *  3/1990  Kanetaki et al. ............ 438/243

5,501,893 A       3/1996  Laermer et al.

FOREIGN PATENT DOCUMENTS

| EP | 0 553 791 A1 | 8/1993 | |
|----|---|---|---|
| EP | 0 822 582 A2 | 2/1998 | |
| EP | 0 908 936 A2 | 4/1999 | |
| JP | 06310655 | * 11/1994 | ......... H01L/27/108 |

* cited by examiner

Primary Examiner—Charles Bowers
Assistant Examiner—Yennhu B. Huynh
(74) Attorney, Agent, or Firm—Herbert L. Lerner; Laurence A. Greenberg; Werner H. Stemer

(57) ABSTRACT

A method for fabricating trenches for storage capacitors of DRAM semiconductor memories by plasma etching semiconductor substrates, includes fabricating a partial trench region with a cross-sectional profile deviating from essentially constant toward a larger cross-sectional profile. A surface of the partial trench region is passivated and the etching/passivating step is continued periodically, in order to fabricate further partial trench regions, until a predetermined overall trench depth has been reached.

13 Claims, 1 Drawing Sheet

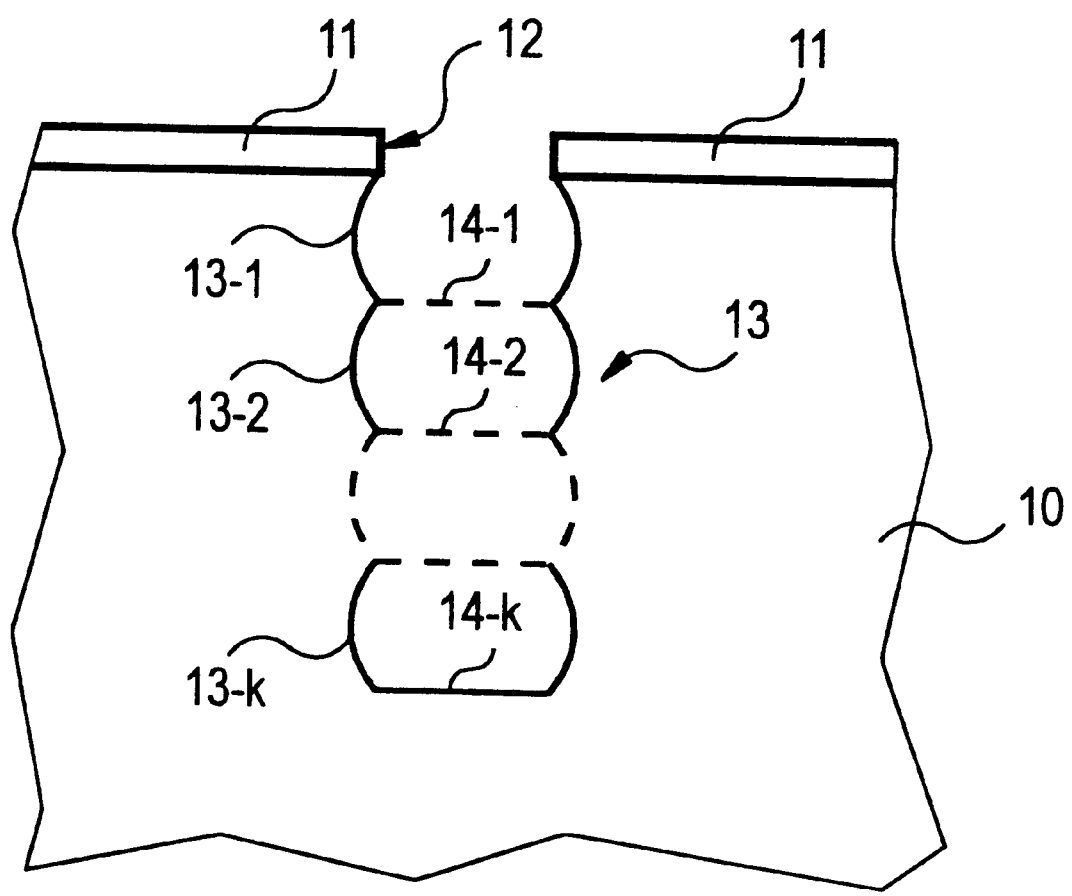

METHOD FOR FABRICATING TRENCHES HAVING HALLOWS ALONG THE TRENCHES SIDE WALL FOR STORAGE CAPACITORS OF DRAM SEMICONDUCTOR MEMORIES

BACKGROUND OF THE INVENTION

FIELD OF THE INVENTION

The present invention relates to a method for fabricating trenches for storage capacitors of DRAM semiconductor memories by plasma etching semiconductor substrates.

In the case of storage capacitors for DRAM semiconductor memories in the form of trench capacitors, as the integration level increases, less and less area is available, that is to say the cross-sectional area or the diameter of the capacitor trenches in the semiconductor substrate inevitably decreases. One possibility for realizing a predetermined capacitance, typically about 45 fF, is to increase the trench depth accordingly.

Trenches are typically fabricated by plasma etching in the semiconductor substrate. If that is the case, limits are necessarily encountered in connection with increasing the trench depth of storage capacitors with an increasing integration level of DRAM semiconductor memories, for example a storage capacity of 256 Mbits.

That is because, on one hand, during plasma etching, the etching rate decreases as the etching depth increases because fewer and fewer reactive particles reach the progressively deeper bottom of the trench structure. That becomes more pronounced with an increasing ratio of depth to width, the so-called aspect ratio, of the trench structure. On the other hand, side wall passivation films produced in the course of etching increase the aspect ratio even further, which additionally intensifies the decrease in the etching rate. The two effects mentioned above lead to the etching being slowed down, and thus to the process duration being prolonged, which in turn leads to a considerable increase in process costs.

Furthermore, depending on the process control, the etching ultimately comes to a complete standstill in the event of very large aspect ratios, so that fundamental limits are imposed on arbitrarily increasing the trench depth in a plasma etching process.

A special case in connection with increasing the trench depth is the fabrication of trenches with slightly bulged profiles in the lower region of the trench. However, that enables only very limited increases in capacitance.

The problems outlined above can be countered by using dielectrics having a larger dielectric constant such as e.g. titanium dioxide, instead of customary capacitor dielectrics such as, for example, silicon dioxide, oxide nitrides or oxide-nitride and oxide-nitride-oxide sandwich structures. However, it is not certain whether extremely high demands that are to be made of a CVD deposition method with regard to conformity of the deposited layers can be fulfilled in that case, in particular with trench structures having a large aspect ratio.

European Patent Application 0 553 791 A1 discloses increasing the capacitance of capacitors of the type under discussion without increasing the aspect ratio. That is done by rendering their lower electrode, that is to say that surface of the semiconductor substrate which forms the trench surface, porous by roughening. The roughening can be effected, for example, by anodic oxidation, wet etching or dry etching.

The porosity produced by the roughening process constitutes microdepressions, which signifies an area enlargement and thus an increase in capacitance, with the aspect ratio remaining the same. It is clear that only a comparatively limited area enlargement and thus increase in capacitance can be realized by a method of that type.

SUMMARY OF THE INVENTION

It is accordingly an object of the invention to provide a method for fabricating trenches for storage capacitors of DRAM semiconductor memories, which overcomes the hereinafore-mentioned disadvantages of the heretofore-known methods of this general type and with which, by virtue of a comparatively considerable area enlargement of a trench surface, a correspondingly considerable increase in a capacitance of storage capacitors is possible.

With the foregoing and other objects in view there is provided, in accordance with the invention, a method for fabricating trenches for storage capacitors of DRAM semiconductor memories, which comprises fabricating a first partial trench region with a surface and with a cross-sectional profile deviating from an essentially constant cross-sectional profile toward a larger cross-sectional profile in a semiconductor substrate in a plasma etching step, by setting a predetermined ratio between an isotropic and an anisotropic etching component; passivating the surface of the first partial trench region; and continuing the etching and passivating k times periodically, where k denotes a predetermined integer, to fabricate further partial trench regions adjoining the first partial trench region in a trench course direction, until a predetermined overall trench depth has been reached.

In accordance with another mode of the invention, there is provided a method which further comprises carrying out the fabricating step by fabricating a convex cross-sectional profile as the cross-sectional profile deviating from an essentially constant cross-sectional profile.

In accordance with a further mode of the invention, there is provided a method which further comprises setting the ratio of isotropic to anisotropic etching component in the plasma etching step according to predetermined process parameters.

In accordance with an added mode of the invention, there is provided a method which further comprises setting radio frequency power, pressure, magnetic field strength and/or process gas as a process parameter of the etching step to set the ratio of isotropic to anisotropic etching component.

In accordance with an additional mode of the invention, there is provided a method which further comprises using $NF_3$, $XeF_2$ or $SF_6$ as an etching gas. In accordance with yet another mode of the invention, there is provided a method which further comprises passivating the surface of the partial trench regions by plasma polymerization in a plasma of polymer-forming gases. In accordance with yet a further mode of the invention, there is provided a method which further comprises using $C_nH_{2n+2}$ as a polymer-forming gas. In accordance with yet an added mode of the invention, there is provided a method which further comprises using $CH_4$ as the polymer-forming gas. In accordance with yet an additional mode of the invention, there is provided a method which further comprises using $C_nH_{2n}$ as a polymer-forming gas. In accordance with still another mode of the invention, there is provided a method which further comprises using $CHF_3$, $C_2F_6$ or $C_4F_8$ as a polymer-forming gas.

In accordance with still a further mode of the invention, there is provided a method which further comprises concluding the periodic etching and passivating step, then producing an oxide on the trench surface by thermal growth and subsequently isotropically etching away the oxide.

In accordance with a concomitant mode of the invention, there is provided a method which further comprises carrying out the isotropic etching in a wet or dry etching process.

Other features which are considered as characteristic for the invention are set forth in the appended claims.

Although the invention is illustrated and described herein as embodied in a method for fabricating trenches for storage capacitors of DRAM semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a fragmentary, diagrammatic, sectional view of a trench structure, which is fabricated according to the invention, for a storage capacitor of DRAM semiconductor memories.

DESCRIPTION OF THE PREFERRED EMBODIMENTS

Referring now in detail to the single FIGURE of the drawing, there is seen a trench 13 for a storage or trench capacitor of a DRAM semiconductor memory which is fabricated by plasma etching in a semiconductor substrate 10, typically made of silicon. To that end, an etching mask 11 containing an etching window 12 is provided on an upper surface of the substrate 10.

In accordance with one feature of the invention, a first partial trench region 13-1, with a bottom 14-1 indicated by a broken line, is then fabricated in the semiconductor substrate material in a first plasma etching step. More specifically, that step is carried out in such a way that, as a result of setting a predetermined ratio between isotropic and anisotropic etching components, the partial trench region 13-1 has a cross-sectional profile deviating from an essentially constant cross-sectional profile toward a larger cross-sectional profile. In this case, the term "essentially" constant cross-sectional profile means that even in the case of a desired constant cross-sectional profile, the latter is never exactly constant in practice. This cross-sectional profile which is fabricated in accordance with that one feature of the invention is preferably a convex profile, as illustrated in the figure.

The ratio of isotropic to anisotropic etching component of the plasma etching process can be set by way of ion bombardment by a selection of process parameters, such as radio frequency power, pressure, magnetic field strength and/or process gas. Examples of suitable etching gases are $NF_3$, $XeF_2$ or $SF_6$.

Then, in accordance with a further feature of the invention, the surface of the first trench region 13-1, including the bottom 14-1 thereof, is passivated. According to a development of the invention, this can be carried out through the use of plasma polymerization with gases that form polymers in a plasma. Suitable gases in this case are $C_nH_{2n+2}$ such as, for instance, $CH_4$, $C_nH_{2n}$ or e.g. $CHF_3$, $C_2F_6$, $C_4F_8$.

It should be mentioned that passivation layers of this type are not separately illustrated in the figure of the drawing, for the sake of clarity.

After the etching/passivation process explained above has been concluded, it is continued k times periodically, in order to fabricate further partial trench regions 13-2, ..., 13-k adjoining the first partial trench region 13-1 and having respective bottoms 14-2, ..., 14-k, where k denotes a predetermined integer. That process is continued until a predetermined overall trench depth has been reached. In this case, after the passivation step of the preceding partial trench region, in the etching step, the passivation layer in the form of a polymer film is removed by ion bombardment of the bottom of the respective partial trench region and the etching is continued there.

The profile of the trench 13 formed by the partial trench regions 13-1, 13-2, ..., 13-k has convex bulges as illustrated in the figure. As a result, the trench surface and thus the capacitance of a trench capacitor formed in the trench 13 are enlarged, with reference to a predetermined overall trench depth.

Admittedly, the problems outlined in the introduction which are manifested during the plasma etching of trenches with a large aspect ratio cannot be completely eliminated by the method according to the invention. However, the method according to the invention nevertheless affords the advantage of a possible crucial enlargement of the trench surface and an associated increase in capacitance, up to an overall trench depth at which these problems are still of no serious consequence. To put it another way, given a predetermined capacitance, the method according to the invention affords the possibility of a decrease in the overall trench depth with reference to an essentially constant cross-sectional profile.

Finally, it is also pointed out that, in accordance with a development of the invention, after the conclusion of the periodic etching/passivation process, an oxide can be grown thermally and subsequently etched away again wet-chemically or isotropically by dry etching, for the purpose of rounding peaks in the boundary regions between the partial trench regions 13-1, 13-2, ..., 13-k. In this case, the oxide grows in the region of peaks from both sides as surface layers that move toward one another on the semiconductor material. In the course of the subsequent etching-away process, peaks are then rounded as a result of the elimination of the practically continuous oxide there. This process is readily controllable altogether due to the good controllability both of the thermal growth process and of the etching process.

I claim:

1. A method for fabricating trenches for storage capacitors of DRAM semiconductor memories, which comprises:

fabricating a first partial trench region with a surface and with a cross-sectional profile deviating from an essentially constant cross-sectional profile toward a larger cross-sectional profile in a semiconductor substrate in a plasma etching step, by setting a predetermined ratio between an isotropic and an anisotropic etching component;

passivating the surface of the first partial trench region; and continuing the etching and passivating k times periodically, where k denotes a predetermined integer, to fabricate further partial trench regions adjoining the first partial trench region in a trench course direction, until a predetermined overall trench depth has been reached.

2. The method according to claim 1, which further comprises carrying out the fabricating step by fabricating a convex cross-sectional profile as the cross-sectional profile deviating from an essentially constant cross-sectional profile.

3. The method according to claim 1, which further comprises setting the ratio of isotropic to anisotropic etching component in the plasma etching step according to predetermined process parameters.

4. The method according to claim 1, which further comprises setting at least one process parameter of the etching step selected from the group consisting of radio frequency power, pressure, magnetic field strength and process gas to set the ratio of isotropic to anisotropic etching component.

5. The method according to claim 1, which further comprises using a gas selected from the group consisting of $NF_3$, $XeF_2$ and $SF_6$ as an etching gas.

6. The method according to claim 1, which further comprises passivating the surface of the partial trench regions by plasma polymerization in a plasma of polymer-forming gases.

7. The method according to claim 6, which further comprises using $C_nH_{2n+2}$ as a polymer-forming gas.

8. The method according to claim 7, which further comprises using $CH_4$ as the polymer-forming gas.

9. The method according to claim 6, which further comprises using $C_nH_{2n}$ as a polymer-forming gas.

10. The method according to claim 6, which further comprises using a gas selected from the group consisting of $CHF_3$, $C_2F_6$ and $C_4F_8$ as a polymer-forming gas.

11. The method according to claim 1, which further comprises concluding the periodic etching and passivating step, then producing an oxide on the trench surface by thermal growth and subsequently isotropically etching away the oxide.

12. The method according to claim 11, which further comprises carrying out the isotropic etching in a wet etching process.

13. The method according to claim 11, which further comprises carrying out the isotropic etching in a dry etching process.

* * * * *